United States Patent [19]

Sunaga

[11] Patent Number: 5,504,702
[45] Date of Patent: Apr. 2, 1996

[54] DRAM CELL

[76] Inventor: Toshio Sunaga, 4-8-4 Wakakusa, Kusatsu-shi, Shiga-ken, Japan

[21] Appl. No.: 266,904

[22] Filed: Jun. 27, 1994

[30]     Foreign Application Priority Data

Jun. 30, 1993   [JP]   Japan .................... 5-162615

[51] Int. Cl.$^6$ ............................. G11C 11/24; G11C 13/00
[52] U.S. Cl. .............................. 365/149; 257/299
[58] Field of Search ............................. 365/149; 257/296, 257/298, 299

[56]         References Cited

U.S. PATENT DOCUMENTS 4,591,738  5/1986  Biacas, Jr. .................... 257/299
5,412,603  5/1995  Schreck ........................ 257/299

*Primary Examiner*—Terrell W. Fears
*Attorney, Agent, or Firm*—William P. Skladony

[57]          ABSTRACT

Disclosed is a DRAM cell which has a transistor and a cell capacitor for storing a charge. Additionally, the cell further includes a second capacitor for charge pumping the cell capacitor, the two capacitors being connected to a common junction. The second end of the charge pump capacitor, namely the end which does not share a common junction with the cell capacitor, is connected to a control line which is driven during writing so as to boost the storage voltage in the cell capacitor. Through this arrangement, the storage voltage of the cell capacitor can be boosted by means other than a word line boost.

8 Claims, 7 Drawing Sheets

DRAM CELL

FIELD OF THE INVENTION

This invention relates to a DRAM cell of MOS structure, and more particularly to a DRAM cell with a charge pump function to increase the storage voltage in memory cell.

BACKGROUND OF THE INVENTION

Conventionally, a DRAM (dynamic random access memory) performs writing in a cell capacitor through an NMOS or PMOS charge transfer gate. Therefore, when the cell transistor is driven between a power supply ($V_{DD}$) and ground (GND), threshold voltage loss causes the high level, for example, bit "1" to be $V_{DD}-V_{TN}$ for NMOS, or the low level, for example, bit "0" to be $|V_{TP}|$ for PMOS, both of which inhibit full rail writing of $V_{DD}$–GND, where $V_{TN}$ and $V_{TP}$ are threshold voltages of NMOS and PMOS, respectively. Full rail writing can be usually performed by a word line boost. That is, the gate is driven to a voltage higher than $(V_{DD}+V_{TN})$ for the NMOS cell transistor, or to a voltage lower than $(GND-V_{TP})$ for the PMOS cell transistor. Usually, this word line boost approach is widely used for NMOS.

U.S. Pat. No. 4,678,941 (Japanese Published Unexamined Patent Application No. 61-246994) discloses a word line clock circuit which negatively drives the word line in order to compensate for the threshold voltage loss in the PMOS cell transistor. However, when an NMOS transistor is used for the word line driver and the word line is boosted to a voltage lower than GND, there is a possibility that the junction between the substrate and a device region of the NMOS transistor will be forward biased thus giving rise to latch-up. Therefore, only a small amount of boost can essentially be allowed so as not to cause latch-up. To increase the boost, special considerations to prevent latch-up become necessary. Although the latch-up problem can be eliminated by using PMOS as the word line driver, PMOS is not desirable because it has a low driving capability at low voltages, and cannot access at high speed.

Japanese Published Unexamined Patent Application 57-18081 discloses a DRAM cell which increases the amount of signal charge stored in the cell capacitor by controlling the potential of an electrode of the cell capacitor. The cell capacitor is formed by a diffusion region of the cell transistor and a plate electrode provided on this diffusion region with an insulating layer therebetween. During writing, a voltage higher than full rail can be written by controlling the potential of the plate electrode. However, in DRAMs using a trench capacitor, the substrate is used as a capacitor electrode corresponding to the above-mentioned plate electrode. The substrate is usually connected to a reference voltage to maintain the threshold voltage of MOS transistors at constant, and to stabilize their operation. Therefore, the method of the above patent cannot be used for DRAMs using the trench capacitors.

SUMMARY OF THE INVENTION

Therefore, an object of this invention is to provide a DRAM cell which can compensate for the reduction of storage voltage caused by the threshold voltage loss of a cell transistor without using word line boost.

The memory cell according to this invention has a capacitor for charge pumping which is connected to a common junction between a MOS cell transistor and a cell capacitor which are connected in series. The other end of the charge pump capacitor is connected to a control line which is driven during writing so as to boost the storage voltage in the cell capacitor. When the cell transistor is PMOS, the control line is driven by a positive voltage pulse such that the storage voltage for a low level is boosted in negative direction.

The charge pump capacitor can be provided to overlap the trench capacitor. Therefore, this invention can be incorporated into conventional trench type DRAMs with little interference with their integration density.

DETAILED DESCRIPTION OF THE PREFERRED EMBODIMENT

Figure 1:
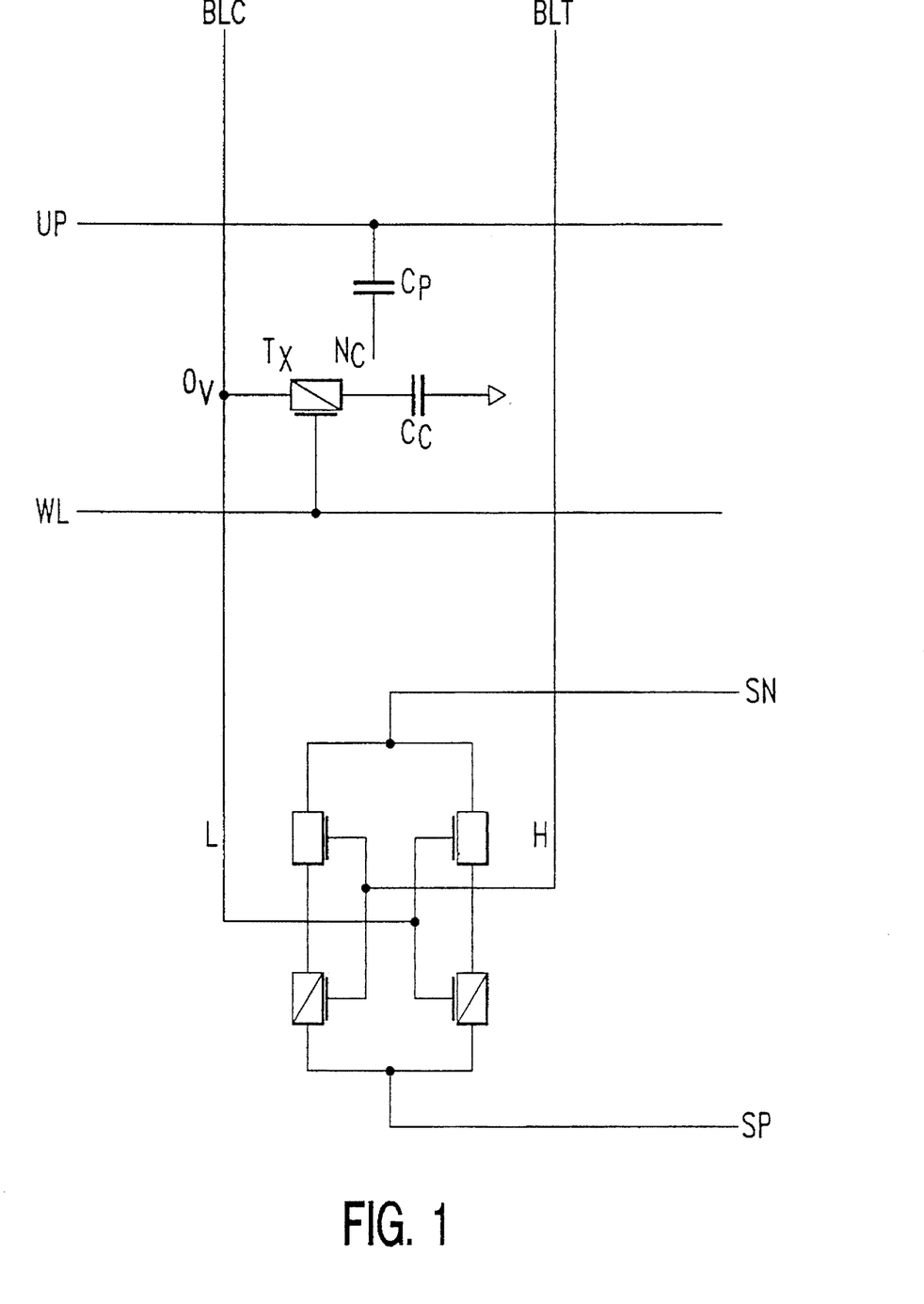
FIG. 1 is a circuit diagram illustrating the circuit configuration of an embodiment according to this invention.

FIG. 1 shows a circuit configuration of an embodiment of this invention. In the figure, an ordinary one-transistor DRAM cell is added with a capacitor $C_P$ for charge pumping and a charge pump control line UP for driving it. WL is a word line of the DRAM, BLT and BLC are a pair of bit lines, $C_C$ is a cell capacitor, and $T_X$ is a PMOS type charge transfer cell transistor. Two pairs of cross-coupled CMOS inverters driven by SP and SN act as a sense amplifier.

Figure 2:
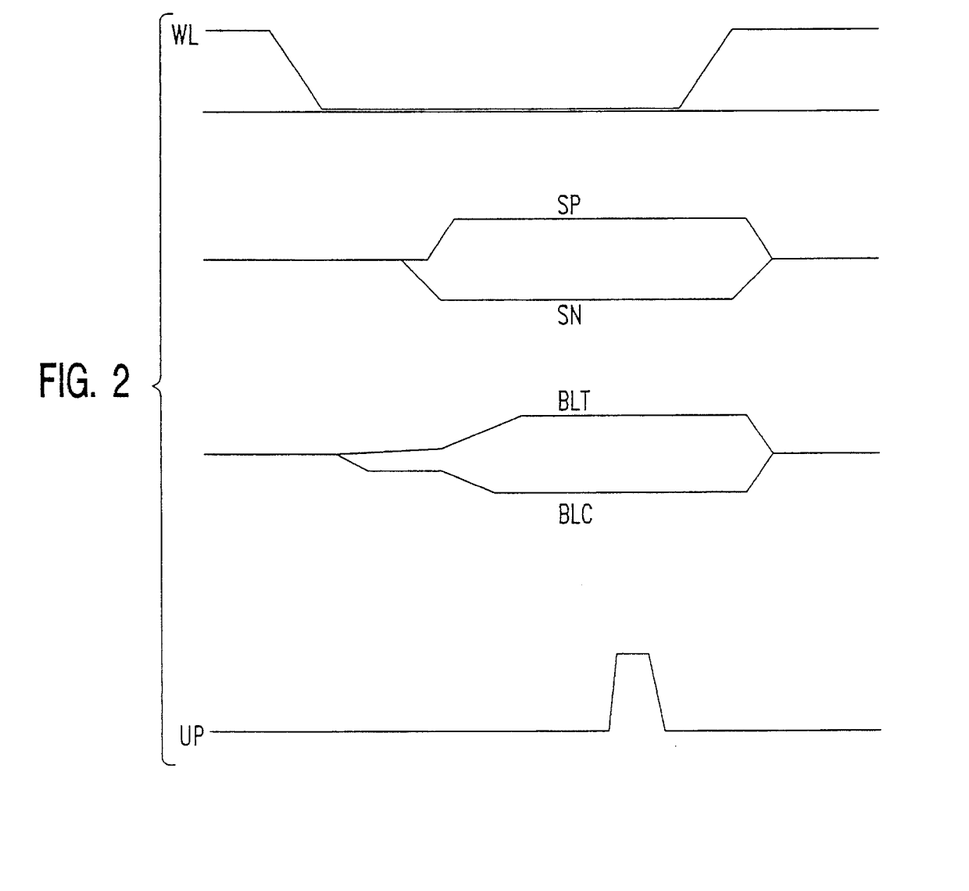
FIG. 2 is a timing chart illustrating the operation of FIG. 1.

FIG. 2 is a timing chart showing an example of the operation in which a memory cell storing a bit "0" (low level) is read, and the read bit "0" is restored. The operation of the word line WL, the sense amplifier activation signals SP and SN, and the bit line pair BLT and BLC is the same as that of the prior art, except that the control line UP is pulse-driven during writing.

At stand-by, SP/SN and BLT/BLC are at a precharge voltage such as ½ $V_{DD}$ or ⅔ $V_{DD}$, WL at $V_{DD}$, and UP at ground (hereinafter indicated as "GND"). When access is started, the word line WL goes to GND, the cell transistor $T_X$ turns on, and a read signal appears across the bit line pair BLT and BLC. When a sufficient read signal has been developed, the sense amplifier is activated by turning SN to GND and SP to $V_{DD}$, whereby the bit line pair BLT/BLC are driven to $V_{DD}$ and GND, respectively. The operation to this point corresponds to the read operation of an ordinary one-transistor DRAM.

The control line UP is initially at the GND level, and the cell capacitor $C_C$ is connected to the reference voltage GND. Therefore, in this state, the cell capacitor $C_C$ and the charge pump capacitor $C_P$ are connected in parallel between a node $N_C$ and GND. When the sense amplifier is activated, BLT turns to $V_{DD}$, BLC turns to GND, and the capacitors $C_C$ and $C_P$ are charged to $|V_{TP}|$ (about 1.2 V). The node $N_C$ is at a voltage of $V_{TP}$. Then, when the control line UP is driven by a positive pulse having a voltage level of $V_{DD}$, the capacitor Cp is charged with charge of $(V_{DD}-|V_{TP}|)C_P$. When the control line UP returns to GND before the levels of WL, SP/SN, and BLT/BLC change, the node $N_C$ is pulled in negative direction by the charge of the capacitor $C_P$. At this time, the node $N_C$ is at a voltage lower than $|V_{TP}|$, because the transistor $T_X$ is off and there is no conduction path for the charge of the capacitors $C_C$ and $C_P$ to pass through. Then, when WL is returned to $V_{DD}$ as shown in FIG. 2, a voltage lower than $|V_{TP}|$ will be written into $C_C$ and $C_P$.

Thus, when a PMOS transfer transistor is used, the stored voltage for bit "0" is usually limited to $V_{TP}$, but according to this invention in which the charge pumping is used, the writing of a voltage lower than $V_{TP}$ is possible so that the read signal can be increased.

The control line UP does not affect the writing operation of bit "1." In the case of bit "1," BLC and BLT are set to $V_{DD}$ and GND, respectively, by the activated sense amplifier. When WL is at GND, the cell transistor $T_X$ is on. Thus, even if the control line UP is pulse driven, the node $N_C$ is coupled to BLC through the cell transistor $T_X$, and clamped to $V_{DD}$ by the sense amplifier. Therefore, the voltage of $V_{DD}$ is written for bit "1" regardless of the charge pump pulse UP.

Figure 3:
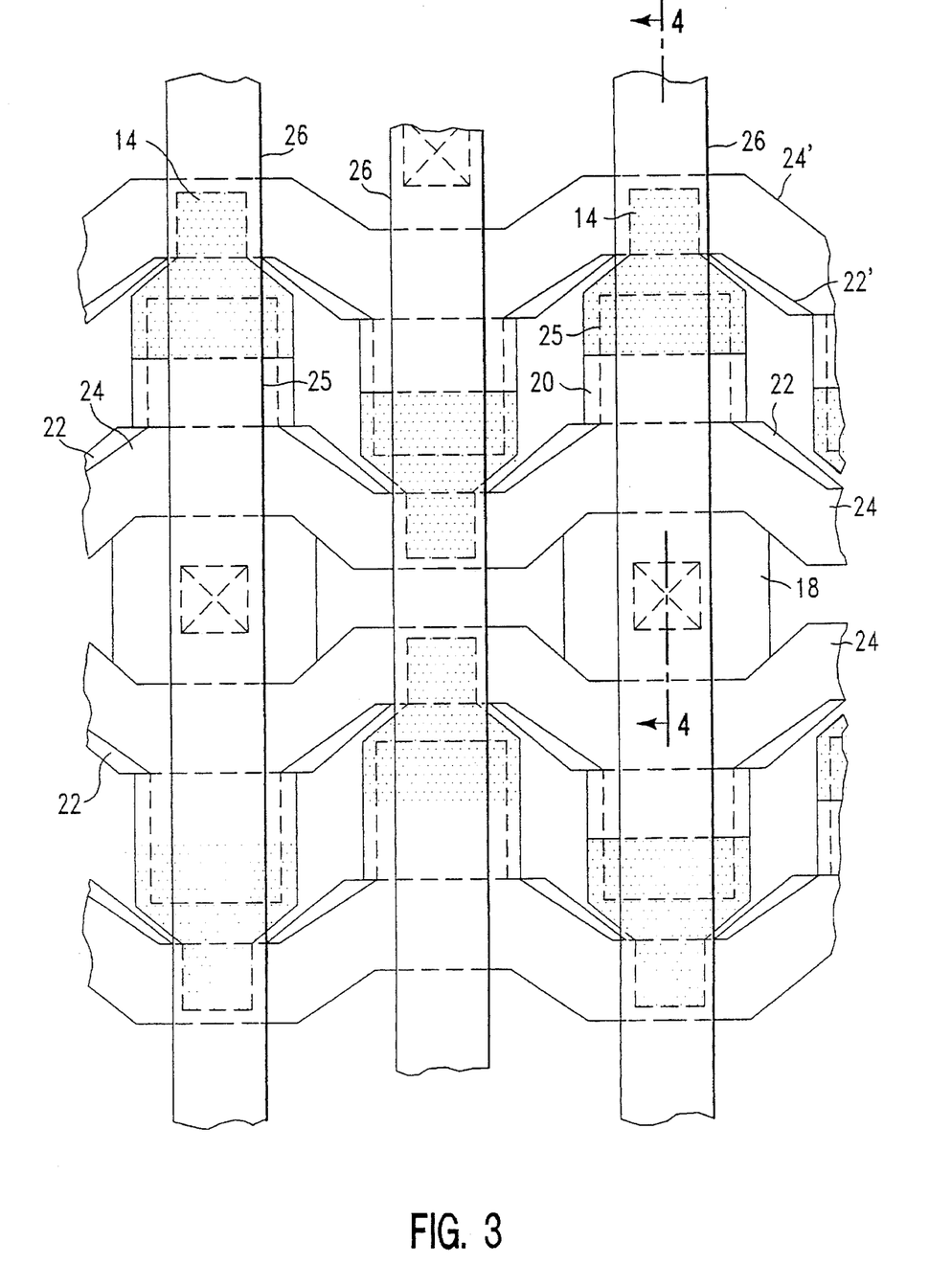
FIG. 3 is a plan view illustrating the structure of the embodiment according to this invention.
Figure 4:
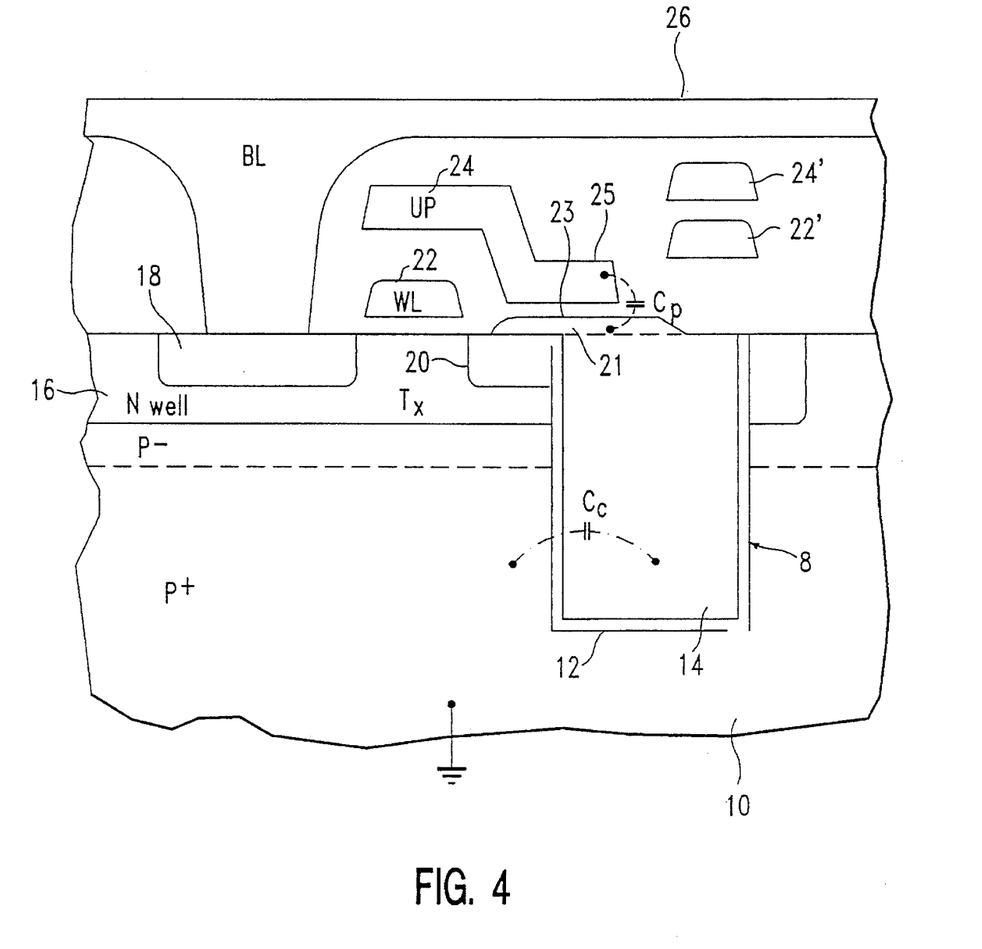
FIG. 4 is a cross-sectional view taken along line A—A in FIG. 3.

FIGS. 3 and 4 illustrate the structure of integrated circuit for the DRAM cell using this invention. The memory cell has a trench capacitor 8. This cell has an SPT (Substrate Plate Trench) cell structure disclosed in U.S. Pat. No. 4,688,063 (Japanese Published Examined Patent Application No. 4-44428). The trench capacitor 8 serving as the cell capacitor is formed by a silicon substrate 10, an insulating layer 12 formed in the internal wall of the trench, and a trench conductor 14, such as polysilicon, filling in the trench. The substrate 10 is connected to the reference voltage GND. The P⁻ epitaxial layer of the substrate 10 is formed with a N-type well 16 in which a PMOS cell transistor $T_X$ is formed. The drain region 18 of the transistor $T_X$ is connected to a bit line BL, while the source region 20 is connected to the trench conductor 14 through a connecting conductor 21 such as doped polysilicon. A polysilicon gate electrode 22 serves as a word line WL. The word line extends in a direction orthogonal to the bit line.

Provided on the word line 22 is a conductor 24 serving as a charge pump control line UP. The conductor 24 extends along the word line, and has a portion 25 projecting sideways so as to at least partially overlap the trench conductor 14. The conductor portion 25 is separated from the trench conductor 14 and the connecting conductor 21 by an insulating layer 23 and forms the charge pump capacitor $C_P$. The conductor 24 may be provided in such a manner that the conductor portion 25 extends into the trench, and forms the capacitor $C_P$ together with the trench conductor 14 in the trench. In this case, $C_P$ may have a larger value.

Now, it is explained what voltage the node $N_C$ in FIG. 1 assumes when using the charge pump of this invention. When the control line UP is at $V_{DD}$, the capacitors $C_P$ and $C_C$ have a charge as given by the following equations, respectively.

$$Q_P=(V_{DD}-|V_{TP}|)C_P$$

$$Q_C=|V_{TP}|C_C$$

Then, when the control line UP at $V_{DD}$ is made to be GND, the charge of $(V_{DD}-|V_{TP}|)C_P-C_PV_W$ is drawn from $C_C$ where $V_W$ is the voltage at the node $N_C$ at that moment, and the following equation is given.

$$V_{TP}C_C-\{(V_{DD}-|V_{TP}|)C_P-C_PV_W\}=C_CV_W$$

Therefore, the write voltage $V_W$ for bit "0" when the control line UP returns to GND is given by:

$$V_W=\{|V_{TP}|C_C-(V_{DD}-|V_{TP}|)C_P\}/(C_P+C_C)$$

For example, assuming $C_C$=70 fF, $C_P$=17 fF, $V_{DD}$=3 V, $|V_{TP}|$=1.2 V, $V_W$ becomes 0.61 V so that a voltage lower than 1.2 V when no $C_P$ is provided can be written. This equation also indicates that various voltages can be written by selecting the capacitances of $C_P$ and $C_C$, and magnitude of $V_{DD}$. If it is desired to make $V_W$=GND, or bit "0" at 0 V, $C_P$ will be 0.67 $C_C$ from the above equation, so that it will be sufficient to make $C_P$ about 67% of the cell capacitance $C_C$. If it is not possible to sufficiently increase the value of $C_P$, $V_{DD}$ may be increased. For example, if $V_{DD}$ is set to 5 V, then $V_W$ is 0 V at $C_P$=0.3 $C_C$.

Figure 5:
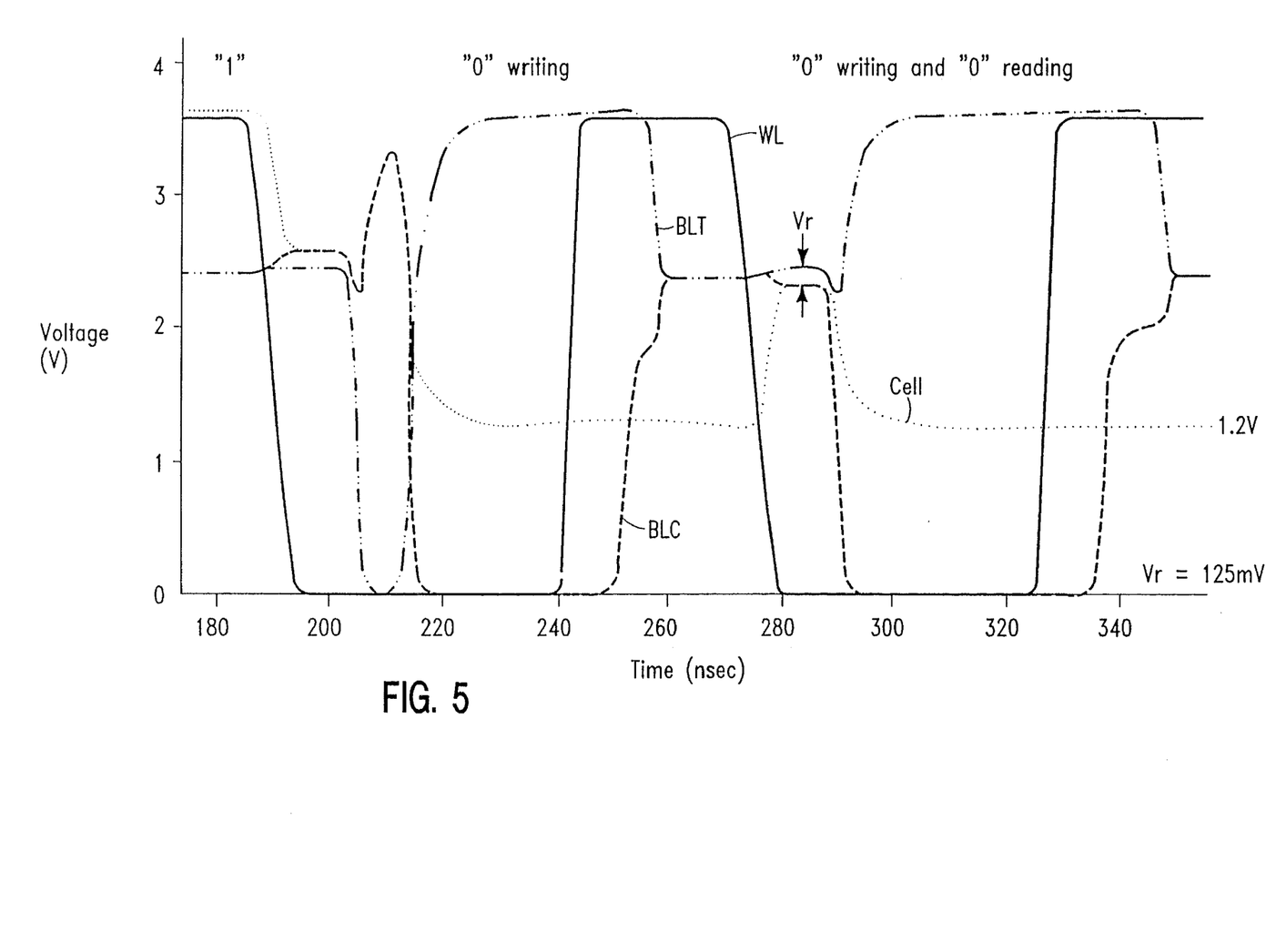
FIG. 5 is a chart illustrating signal waveforms of the prior art.
Figure 6:
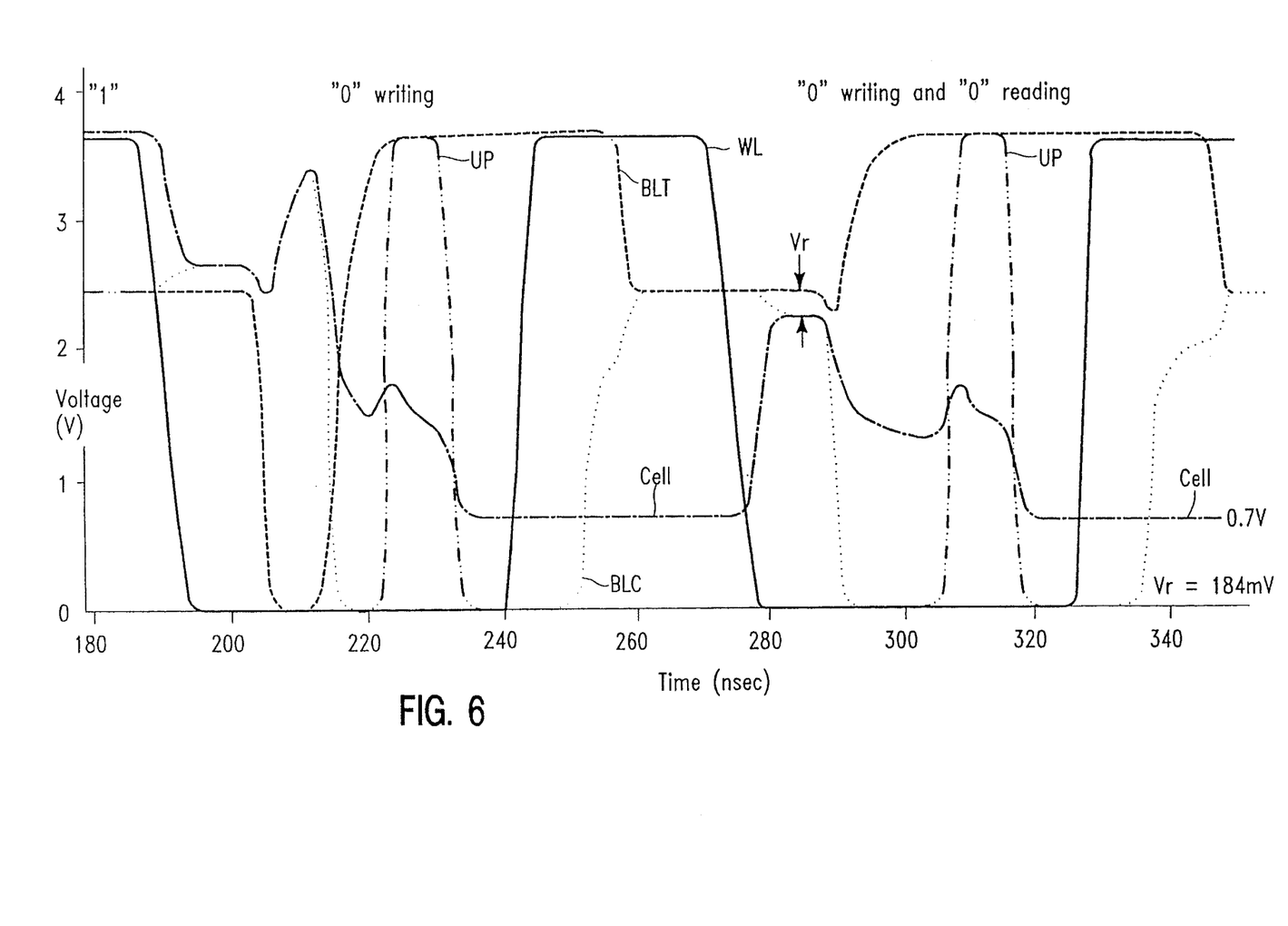
FIG. 6 is a chart illustrating signal waveforms of the embodiment according to this invention.
Figure 7:
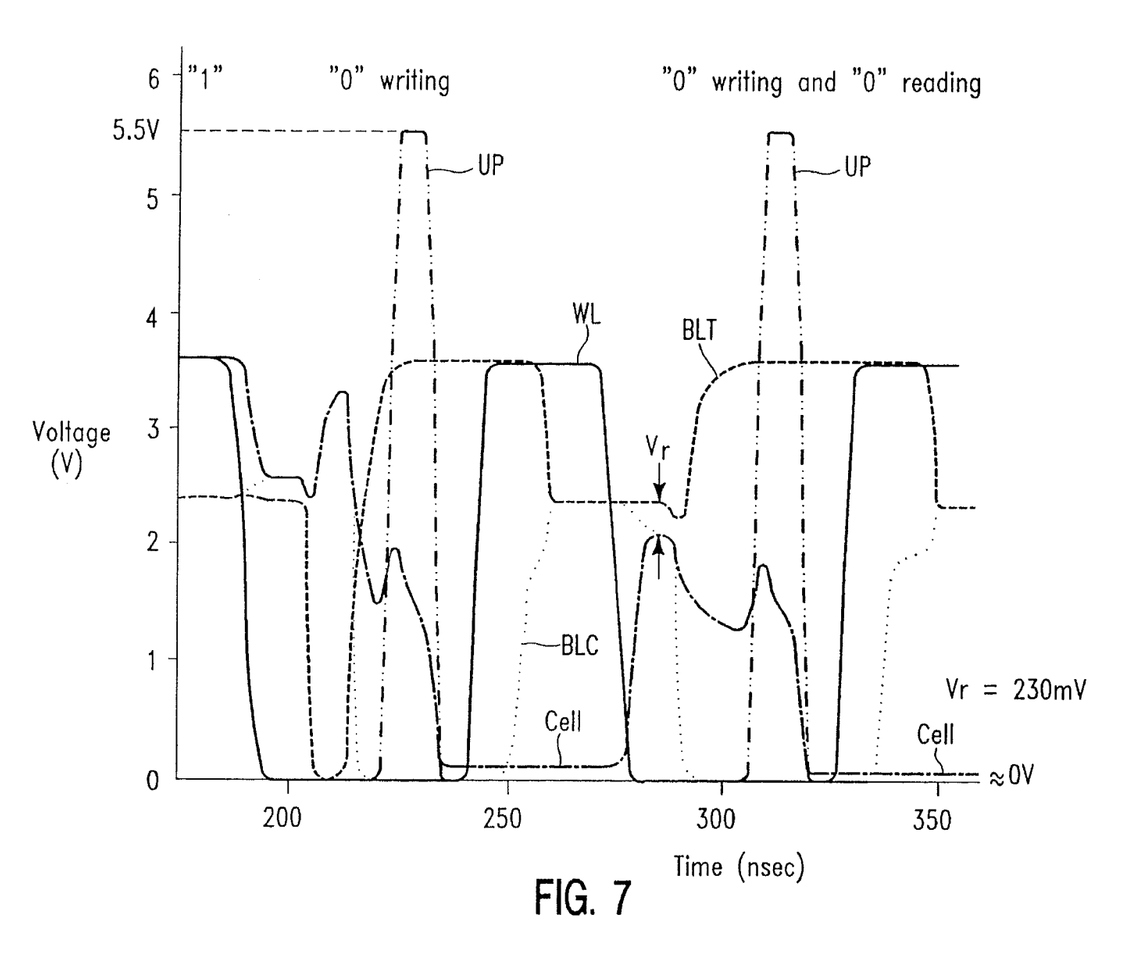
FIG. 7 is a chart illustrating signal waveforms of the embodiment according to this invention.

FIGS. 5–7 show examples of operation by ASTAP simulation. These figures show an operation in which a bit "0" (low level) is written into a memory cell storing a bit "1" (high level), the written bit "0" is read and written again (refreshed). FIG. 5 shows a conventional operation, while FIGS. 6 and 7 show ones using the charge pump according to this invention. FIGS. 6 and 7 are basically the same as the conventional operation in FIG. 5, except for the use of UP pulse and the difference in cell voltage. FIG. 6 uses the UP pulse at 3.6 V, while FIG. 7 uses the UP pulse at 5.5 V.

In the conventional operation in FIG. 5, the cell voltage for bit "0" is 1.2 V, and the read signal $V_r$ is 125 mV. FIG. 6 is a case where $C_P$ of 17 fF is added, and 3.6 V UP pulse is used, in which the cell voltage for bit "0" becomes 0.7 V, and the read signal $V_r$ is 184 mV and shows an increase of about 50%. FIG. 7 shows a case where the $C_P$ is similarly 17 fF, and 5.5 V UP pulse is used, in which the cell voltage for bit "0" is substantially 0 V, and the read signal $V_r$ increases to 230 mV.

Although a memory using PMOS cell transistors has been illustrated in the above, this invention can also be applied to a memory using NMOS cell transistors. In such a case, the polarity of word line signal is inverted, and the charge pump capacitor $C_P$ will be pulse-driven from a high level to a low level by the control line UP.

In accordance with the foregoing, it will be clear that one of the advantages of the embodiments of the present invention discussed above is that it is possible to increase the storage voltage of the capacitor and thus read signal without using word line boost. Additionally, the charge pump capacitor $C_P$ can be formed in the region of the trench capacitor so that this invention can be incorporated in a trench type DRAM with little impairment to the integration density of the trench type DRAM. Yet another advantage is that because the storage voltage for bit "0" can be made below 0 V, in other words, because a voltage exceeding the range of bit line voltage swing can be written, it is possible to lower the bit line voltage swing or the supply voltage so as to deduce power consumption.

I claim:

1. A DRAM cell comprising a MOS type transfer transistor and a cell capacitor which are connected in series, said DRAM cell comprising;
   a charge pump capacitor connected to a common junction between said transistor and said cell capacitor.

2. A DRAM cell as set forth in claim 1, wherein said transistor is a PMOS transistor.

3. A DRAM cell as set forth in claim 1, wherein one of the terminals of said cell capacitor is connected to a predetermined reference potential.

4. A DRAM cell as set forth in claim 2, wherein one of the terminals of said charge pump capacitor is connected to a control line which is driven to a high level during writing.

5. A DRAM cell comprising a MOS type transistor formed in a semiconductor substrate and having a source region, a drain region and a gate electrode, and a trench capacitor formed in said substrate, one electrode of said trench capacitor being provided by said substrate, and the other electrode being provided by a trench conductor which fills in said trench and is connected to said source region, said DRAM cell comprising:

an insulating layer formed on said trench conductor; and a conductive layer formed on said insulating layer so as to at least partially overlap said trench conductor;

wherein said trench conductor, said insulating layer and said conductive layer form a charge pump capacitor.

6. A DRAM cell as set forth in claim 5, wherein said MOS type transistor is a PMOS transistor.

7. A DRAM cell as set forth in claim 5, wherein said substrate is connected to a predetermined reference potential.

8. A DRAM cell as set forth in claim 6, wherein said conductive layer is connected to a control line which is driven to a high level during writing.

* * * * *